(12) United States Patent
Huang et al.

(10) Patent No.: US 10,141,035 B1
(45) Date of Patent: Nov. 27, 2018

(54) MEMORY CELL WITH A READ SELECTION TRANSISTOR AND A PROGRAM SELECTION TRANSISTOR

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Tsai-Yu Huang, Hsinchu County (TW); Pin-Yao Wang, Hsinchu (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/671,157

(22) Filed: Aug. 8, 2017

(30) Foreign Application Priority Data

Jul. 12, 2017 (CN) .......................... 2017 1 0564873

(51) Int. Cl.
| | |
|---|---|
| G11C 5/02 | (2006.01) |
| G11C 7/12 | (2006.01) |
| G11C 17/18 | (2006.01) |
| G11C 11/56 | (2006.01) |
| G11C 5/06 | (2006.01) |
| H03K 19/0185 | (2006.01) |

(52) U.S. Cl.
CPC .................. *G11C 7/12* (2013.01); *G11C 5/06* (2013.01); *G11C 11/5692* (2013.01); *G11C 17/18* (2013.01); *H03K 19/018507* (2013.01)

(58) Field of Classification Search
CPC .......... G11C 7/12; G11C 5/06; G11C 11/5692
USPC .................... 365/52, 189.01, 189.04, 189.08
See application file for complete search history.

(56) References Cited

U.S. PATENT DOCUMENTS

| | | | | |
|---|---|---|---|---|
| 6,016,268 | A * | 1/2000 | Worley | ................. G11C 11/565 365/149 |
| 6,822,888 | B2 | 11/2004 | Peng | |
| 7,218,547 | B2 | 5/2007 | Kurth | |
| 7,642,588 | B2 * | 1/2010 | Cheng | ................... G11C 11/403 257/302 |
| 9,589,611 | B2 * | 3/2017 | Ishizu | ...................... G11C 7/12 |
| 9,691,445 | B2 * | 6/2017 | Giterman | .............. G11C 11/403 |

* cited by examiner

*Primary Examiner* — Connie Yoha
(74) *Attorney, Agent, or Firm* — Winston Hsu

(57) ABSTRACT

The memory cell includes a read selection transistor, a program selection transistor, and an anti-fuse capacitor. The read selection transistor has a first terminal coupled to a bit line, a second terminal, and a control terminal coupled to a read word line. The program selection transistor has a first terminal coupled to the second terminal of the read selection transistor, a second terminal coupled to a high voltage control line, and a control terminal coupled to a program word line. The anti-fuse capacitor has a first terminal coupled to the second terminal of the read selection transistor, and a second terminal coupled to a low voltage control line.

18 Claims, 4 Drawing Sheets

MEMORY CELL WITH A READ SELECTION TRANSISTOR AND A PROGRAM SELECTION TRANSISTOR

BACKGROUND OF THE INVENTION

1. Field of the Invention

The present invention is related to a memory cell, especially related to a memory cell having a read selection transistor and a program selection transistor.

2. Description of the Prior Art

Non-volatile memories (NVM) are capable of storing the information even when no power is supplied to the memory blocks. Due to the special characteristics, non-volatile memories are widely used in many kinds of applications. Programmable read-only memory (ROM) is a non-volatile memory commonly used by the field. In prior art, the programmable read-only memory includes rows of fuses, and the fuses can be burnt down by applying electricity to program the data to be stored. However, once the fuse is burnt down, it cannot be recovered. Therefore, after the programmable read-only memory is programmed the first time, it cannot be programmed again, and can only be read by other circuits.

Presently, the programmable read-only memory usually adopts anti-fuse capacitors to replace the fuses. By applying a high voltage to rupture the anti-fuse capacitor, the resistance of the anti-fuse capacitor would be altered and the data can be programmed. With the anti-fuse capacitor, the efficiency of the chip probe (CP) test and the final test (FT) can be improved, resulting in a higher yield rate of the programmable read-only memory. In addition, to control each memory cell of the programmable read-only memory, the programmable read-only memory has to be able to perform program operations and read operations to the desired memory cells. Therefore, to layout the memory cells efficiently while maintaining the flexibility of operations can be challenging.

SUMMARY OF THE INVENTION

One embodiment discloses a memory cell. The memory cell includes a read selection transistor, a program selection transistor, and an anti-fuse capacitor.

The read selection transistor has a first terminal coupled to a bit line, a second terminal, and a control terminal coupled to a read word line. The program selection transistor has a first terminal coupled to the second terminal of the read selection transistor, a second terminal coupled to a high voltage control line, and a control terminal coupled to a program word line. The anti-fuse capacitor has a first terminal coupled to the second terminal of the read selection transistor, and a second terminal coupled to a low voltage control line.

Another embodiment discloses a memory array. The memory array includes a plurality of bit lines, a plurality of read word lines, a plurality of program word lines, a plurality of high voltage control lines, a plurality of low voltage control lines, and a plurality of rows of memory cells.

Each memory cell includes a read selection transistor, a program selection transistor, and an anti-fuse capacitor. The read selection transistor has a first terminal coupled to a corresponding bit line, a second terminal, and a control terminal coupled to a corresponding read word line. The program selection transistor has a first terminal coupled to the second terminal of the read selection transistor, a second terminal coupled to a corresponding high voltage control line, and a control terminal coupled to a corresponding program word line. The anti-fuse capacitor has a first terminal coupled to the second terminal of the read selection transistor, and a second terminal coupled to a corresponding low voltage control line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
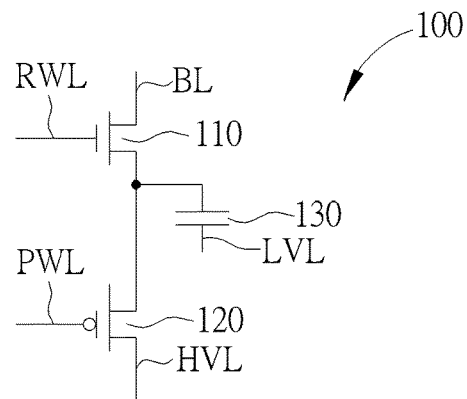
FIG. 1 shows a memory cell according to one embodiment of the present invention.

FIG. 1 shows a memory cell 100 according to one embodiment of the present invention. The memory cell 100 includes a read selection transistor 110, a program selection transistor 120, and an anti-fuse capacitor 130.

The read selection transistor 110 has a first terminal, a second terminal, and a control terminal. The first terminal of the read selection transistor 110 is coupled to a bit line BL, and the control terminal of the read selection transistor 110 is coupled to a read word line RWL. The program selection transistor 120 has a first terminal, a second terminal, and a control terminal. The first terminal of the program selection transistor 120 is coupled to the second terminal of the read selection transistor 110, the second terminal of the program selection transistor 120 is coupled to a high voltage control line HVL, and the control terminal of the program selection transistor 120 is coupled to a program word line PWL. The anti-fuse capacitor 130 has a first terminal and a second terminal. The first terminal of the anti-fuse capacitor 130 is coupled to the second terminal of the read selection transistor 110, and the second terminal of the anti-fuse capacitor 130 is coupled to a low voltage control line LVL.

In FIG. 1, the read selection transistor 110 can be an N-type transistor, and the program selection transistor 120 can be a P-type transistor. Consequently, when the program selection transistor 120 is turned on to pass the high voltage on the high voltage control line HVL to the anti-fuse capacitor 130, the program selection transistor 120 can be turned on by a low voltage, which can help to simplify the power design of the memory cell.

In addition, the anti-fuse capacitor 130 can be implemented by an N-type transistor. For example, the first terminal of the anti-fuse capacitor 130 can be the gate structure of the N-type transistor, and the second terminal of the anti-fuse capacitor 130 can be the N-type doped region.

Figure 2:
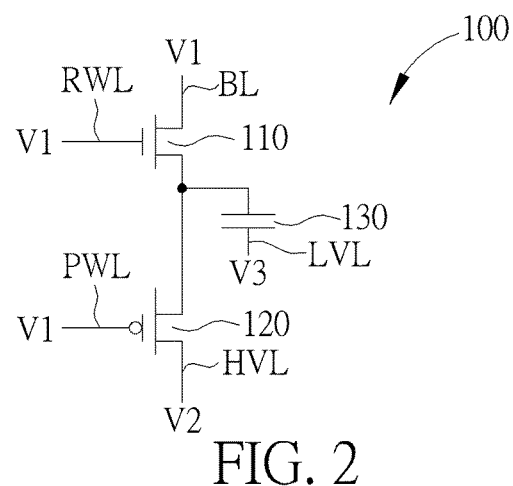
FIG. 2 shows signal voltages received by memory cell in FIG. 1 during the program operation.

FIG. 2 shows the signal voltages received by the memory cell 100 during the program operation. During the program operation of the memory cell 100, the bit line BL, the read word line RWL, and the program word line PWL are all at the first voltage V1, the high voltage control line HVL is at the second voltage V2, and the low voltage control line LVL is at the third voltage V3. In some embodiments, the second voltage V2 can be higher than the first voltage V1, and the first voltage V1 can be higher than the third voltage V3. For example, the second voltage V2 can be 4V, the first voltage V1 can be 0V, and the third voltage V3 can be −2V.

During the program operation, the read selection transistor 110 can be turned off, and the program selection transistor 120 can be turned on. Therefore, the first terminal of the anti-fuse capacitor 130 would receive the second voltage V2 on the high voltage control line HVL through the program selection transistor 120, and the second terminal of the anti-fuse capacitor 130 would receive the third voltage V3 on the low voltage control line LVL. In this case, the big voltage gap between the second voltage V2 and the third voltage V3 can rupture the anti-fuse capacitor 130, so the data can be stored in the memory cell 100.

Figure 3:
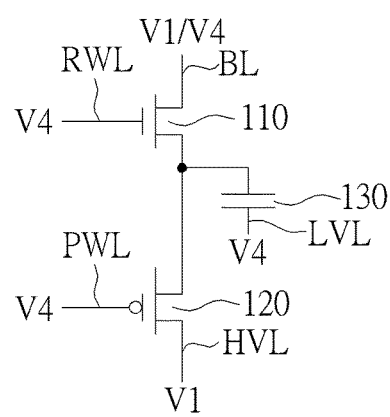
FIG. 3 shows signal voltages received by memory cell in FIG. 1 during the read operation.

FIG. 3 shows the signal voltages received by memory cell 100 during the read operation. During the read operation of the memory cell 100, the read word line RWL, the program word line PWL, and the low voltage control line LVL are all at the fourth voltage V4, and the high voltage control line HVL is at the first voltage V1. In some embodiments, the fourth voltage V4 can be higher than the first voltage V1, and the fourth voltage V4 should be high enough to turn on the read selection transistor 110 and turn off the program selection transistor 120. In addition, the fourth voltage V4 can be lower than the second voltage V2. For example, the second voltage V2 can be 4V, the first voltage V1 can be 0V, and the fourth voltage V4 can be 1.2V.

During the read operation, the read selection transistor 110 can be turned on, and the program selection transistor 120 can be turned off. In this case, the second terminal of the anti-fuse capacitor 130 can receive the fourth voltage V4 on the low voltage control line LVL. Since the anti-fuse capacitor 130 may have different characteristics before and after being ruptured, the bit line BL would be at different voltages according to the situations. For example, if the anti-fuse capacitor 130 has been ruptured, that is, if the memory cell 100 has been programmed, the bit line BL would be charged to a voltage close to the fourth voltage V4 through the read selection transistor 110. In contrast, if the anti-fuse capacitor 130 has not been ruptured, that is, if the memory cell 100 has not been programmed, then the bit line BL would be at the first voltage V1. Therefore, by identifying the voltage on the bit line BL, the data stored in the memory cell 100 can be identified.

Figure 4:
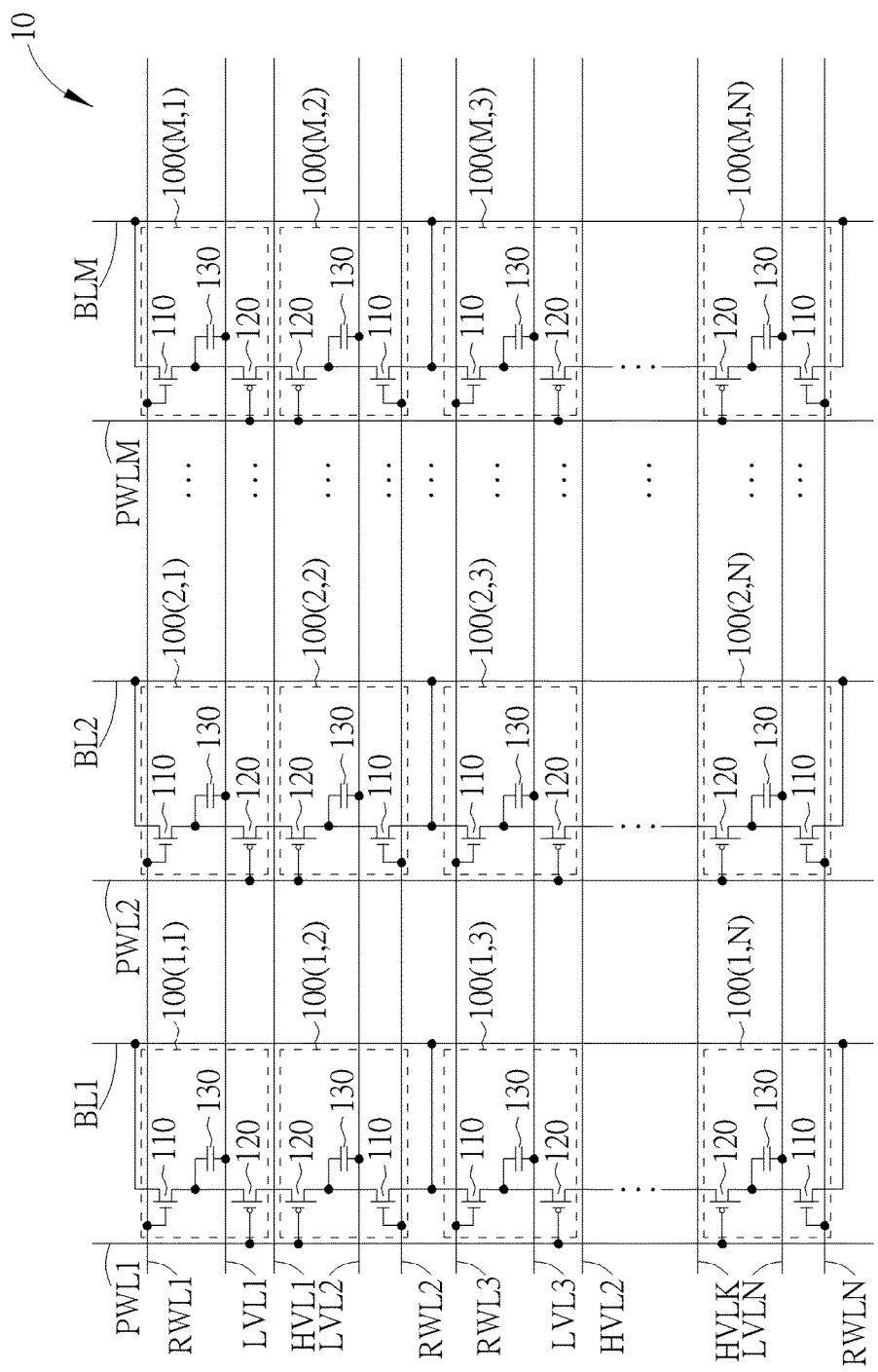
FIG. 4 shows a memory array according to one embodiment of the present invention.

FIG. 4 shows a memory array 10 according to one embodiment of the present invention. The memory array 10 includes M bit lines BL1 to BLM, N read word lines RWL1 to RWLN, M program word lines PWL1 to PLWM, K high voltage control lines HVL1 to HVLK, N low voltage control lines LVL1 to LVLN, and a plurality of memory cells 100(1,1) to 100(M, N). N and M are positive even number, and K can be half of N.

The memory cells 100(1,1) to 100(M, N) can be implemented by the memory cell 10 shown in FIG. 1, that is, each of the memory cells 100(1,1) to 100(M, N) may include a read selection transistor 110, a program selection transistor 120, and an anti-fuse capacitor 130, and can be coupled to a corresponding bit line, a corresponding read word line, a corresponding program word line, a corresponding high voltage control line, and a corresponding low voltage control line.

In FIG. 4, the memory cells 100(1,1) to 100(M, N) can be disposed in rows, for example, the memory cells 100(1,1) to 100(M,1) can be disposed in the same row, and the memory cells 100(1, N) to 100(M, N) can be disposed in the same row. In this case, memory cells disposed in the same row can be coupled to the same read word line, the same low voltage control line, and the same high voltage control line. Also, memory cells disposed in the same row can be coupled to different program word lines and different bit lines.

For example, the memory cells 100(1,1) to 100(M,1) can be coupled to the read word line RWL1, the low voltage control line LVL1, and the high voltage control line HVL1. Also, the memory cell 100(1,1) is coupled to the program word line PWL1 and the bit line BL1, while the memory cell 100(M,1) is coupled to the program word line PWLM and the bit line BLM.

In addition, memory cells disposed in the same column can be coupled to the same program word line and the same bit line. For example, the memory cells 100(1,1) and 100(1, N) are disposed in the same column, and the memory cells 100(M,1) and 100(M, N) are disposed in the same column. The memory cells 100(1,1) and 100(1, N) can be coupled to the program word line PWL1 and the bit line BL1, while the memory cells 100(M,1) and 100(M, N) can be coupled to the program word line PWLM and the bit line BLM.

In FIG. 4, adjacent memory cells in the same column may be coupled with each other for further reducing the layout area and simplifying the routing. For example, the adjacent memory cells 100(1,1) and 100(1, 2) are disposed in the same column, and the second terminal of the program selection transistor 120 of the memory cell 100(1,1) can be coupled to the second terminal of the program selection transistor 120 of the memory cell 100(1, 2). In this case, the program selection transistors 120 of the memory cell 100 (1,1) and the program selection transistors 120 of the memory cell 100(1, 2) would be coupled to the same high voltage control line HVL1.

In addition, the adjacent memory cells 100(1,3) and 100(1, 2) are also disposed in the same column, and the first terminal of the read selection transistor 110 of the memory cell 100(1,3) can be coupled to the first terminal of the read selection transistor 110 of the memory cell 100(1, 2).

Consequently, in the memory array 10, two adjacent rows of memory cells can be coupled to the same high voltage control line or can be coupled to the corresponding bit line with the same connection node, reducing the layout area and simplifying the routing. In some embodiments, the designer can also arrange each row of memory cells independently, and set up the required high voltage control lines and the connection nodes for bit lines according to the system requirement.

Figure 5:
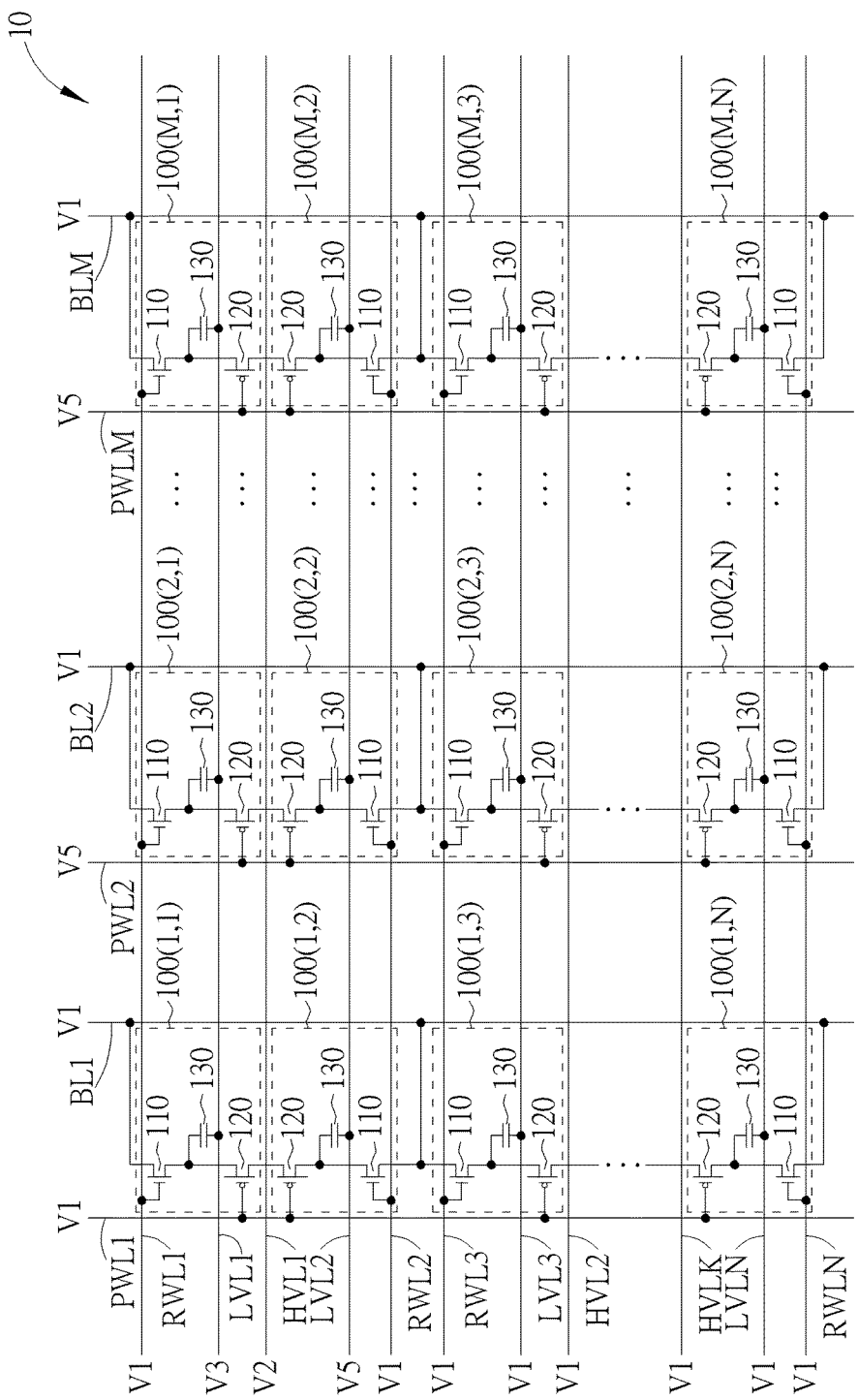
FIG. 5 shows signal voltages received by the memory array in FIG. 4 during the program operation of a memory cell.

FIG. 5 shows the signal voltages received by the memory array 10 during the program operation of the memory cell 100(1,1). During the program operation of the memory cell 100(1,1), the bit line BL1, the read word line RWL1, and the program word line PWL1 are at the first voltage V1, the high voltage control line HVL1 is at the second voltage V2, and the low voltage control line LVL1 is at the third voltage V3.

In this case, the read selection transistor 110 of the memory cell 100(1,1) can be turned off, and the program selection transistor 110 of the memory cell 100(1,1) can be turned on. Therefore, the first terminal of the anti-fuse capacitor 130 of the memory cell 100(1,1) would receive the second voltage V2 through the program selection transistor 120, while the second terminal of the anti-fuse capacitor 130 of the memory cell 100(1,1) would receive the third voltage V3 from the low voltage control line LVL1. Consequently, the big voltage gap between the second voltage V2 and the third voltage V3 can rupture the anti-fuse capacitor 130, so the data can be programmed into the memory cell 100(1,1).

Furthermore, during the program operation of the memory cell 100(1,1), other memory cells should not be programmed. Therefore, during the program operation of the memory cell 100(1,1), the read word line RWL2 would be at the first voltage V1, and the low voltage control line LVL2 would be at the fifth voltage V5. The fifth voltage V5 can be lower than the second voltage V2 and higher than the first voltage V1. For example, the second voltage V2 can be 4V, and the fifth voltage 5V can be 2.5V. Consequently, although the memory cells 100(1,1) and 100(1, 2) are coupled to the same high voltage control line HVL1 and the same program word line PWL1, the memory cell 100(1, 2) would receive the fifth voltage V5 from the low voltage control line LVL2. Since the voltage gap between the second voltage V2 and the fifth voltage V5 is not big enough to rupture the anti-fuse capacitor 130 of the memory cell 100(1, 2), the memory cell 100(1, 2) will not be programmed.

In addition, for the memory cells not being coupled to the same high voltage control line HVL1 as the memory cell 100(1,1), the high voltage control lines can be at a lower voltage, preventing the memory cells from being programmed during the program operation of the memory cell 100(1,1) and saving the power for outputting high voltages.

For example, during the program operation of the memory cell 100(1,1), the high voltage control line HVL2 coupled to the memory cell (1,3) would be at the first voltage V1, the read word line RWL2 coupled to the memory cell 100(1,3) would be at the first voltage V1, and the low voltage control line LVL2 coupled to the memory cell 100(1,3) would be at the first voltage V1. Therefore, the memory cell 100(1,3) will not be programmed during the program operation of the memory cell 100(1,1).

In addition, during the program operation of the memory cell 100(1,1), the memory cells 100(1, 2) to 100(1, M) disposed in the same row as the memory cell 100(1,1) would be coupled to the program word lines PLW2 to PLWN, and the program word lines PLW2 to PLWN can be at the fifth voltage V5. Therefore, during the program operation of the memory cell 100(1,1), the program selection transistors 120 of the memory cells 100(1, 2) to 100(1, M) can be turned off, so the anti-fuse capacitors 130 of the memory cells 100(1, 2) to 100(1, M) will not receive the high voltage on the high voltage control line HVL1, and will not be programmed.

Figure 6:
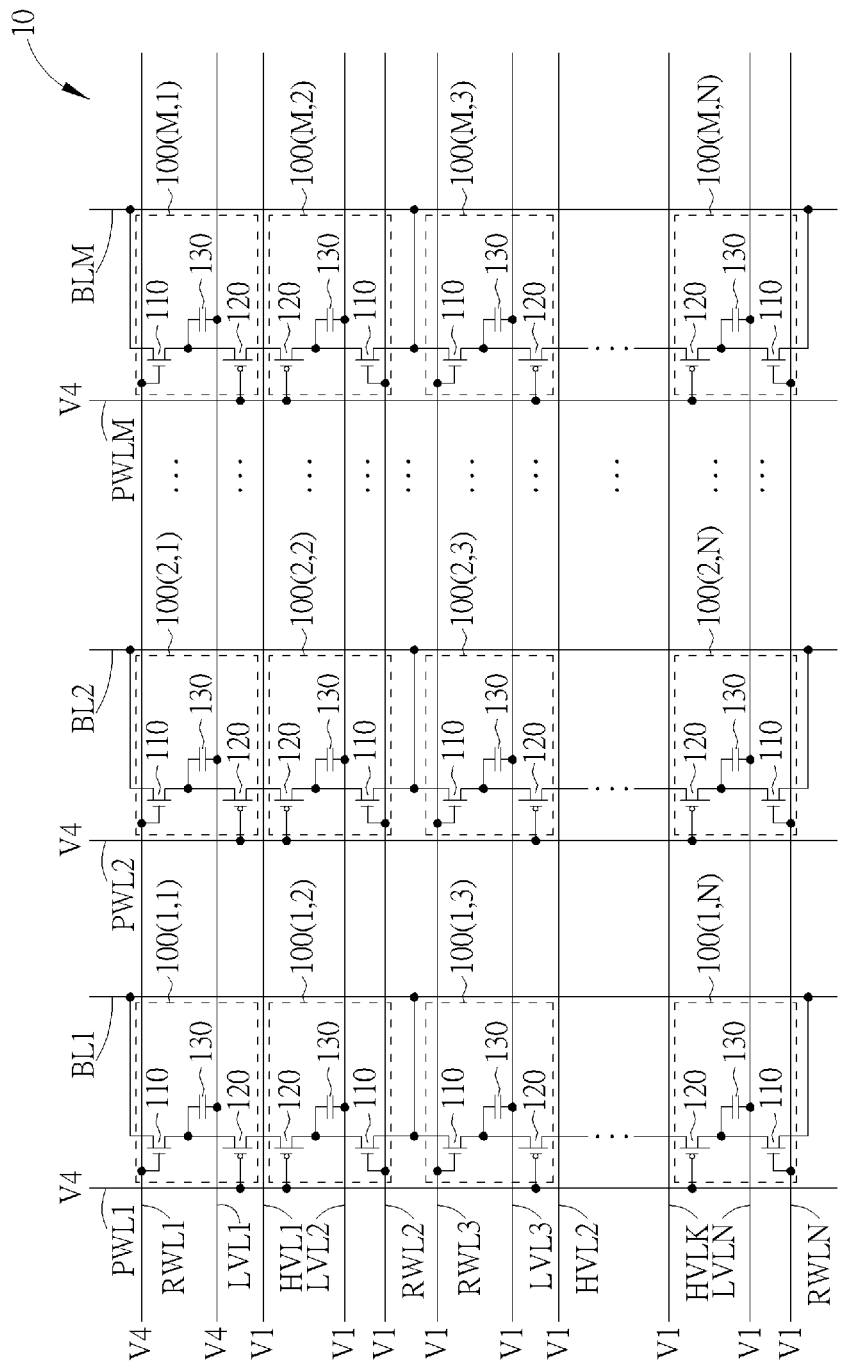
FIG. 6 shows signal voltages received by the memory array in FIG. 4 during the read operation of a memory cell.

FIG. 6 shows the signal voltages received by the memory array 10 during the read operation of the memory cell 100(1,1). During the read operation of the memory cell 100(1,1), the program word line PWL1, the bit line BL1, the read word line RWL1, and the low voltage control line LVL1 are all at the fourth voltage V4, and the high voltage control line HVL1 is at the first voltage V1.

Consequently, the read selection transistor 110 of the memory cell 100(1,1) can be turned on, and the program selection transistor 120 of the memory cell 100(1,1) can be turned off. In this case, the second terminal of the anti-fuse capacitor 130 of the memory cell 100(1,1) would receive the fourth voltage V4 from the low voltage control line LVL1. Since the anti-fuse capacitor 130 has different characteristics before and after being ruptured, the bit line BL1 would be at different voltages according to the situations. Therefore, by identifying the voltage on the bit line BL1, the data stored in the memory cell 100(1,1) can be identified.

In addition, in FIG. 6, memory cells 100(2,1) to 100(M,1) disposed in the same row as the memory cell 100(1,1) are coupled to the same read word line RWL1 and the same low voltage control line LVL1. Therefore, in some embodiments, the users can read the data stored in the memory cells 100(1,1) to 100(M,1) simultaneously. However, in some other embodiments, the users may adopt buffer elements to read the data stored in the memory cells 100(1,1) to 100(M, 1) sequentially.

Moreover, during the read operation of the memory cell 100(1,1), the memory cells disposed in different rows from the memory cell 100(1,1) should not output voltages. For example, for memory cell 100(1, 2), the read word line RWL2 and the low voltage control line LVL2 coupled to the memory cell 100(1, 2) can be at the first voltage V1. Therefore, the read selection transistor 110 of the memory cell 100(1, 2) will be turned off, and the anti-fuse capacitor 130 of the memory cell 100(1, 2) will not generate current.

In summary, the memory cells and the memory arrays provided by the embodiments of the present invention can use the read selection transistors and the program selection transistors for program operations and read operations. Also, different memory cells may be coupled together or coupled to the same high voltage control line, supporting flexible operations, efficient layout, and simple routing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell comprising:
   a read selection transistor having a first terminal coupled to a bit line, a second terminal, and a control terminal coupled to a read word line;
   a program selection transistor having a first terminal directly coupled to the second terminal of the read selection transistor, a second terminal coupled to a high voltage control line, and a control terminal coupled to a program word line; and
   an anti-fuse capacitor having a first terminal directly coupled to the second terminal of the read selection transistor, and a second terminal coupled to a low voltage control line.

2. The memory cell of claim 1, wherein:
   the read selection transistor is an N-type transistor, and the program selection transistor is a P-type transistor.

3. The memory cell of claim 2, wherein:
   the first terminal of the anti-fuse capacitor has a gate structure, and the second terminal of the anti-fuse capacitor is an N-type doped region.

4. The memory cell of claim 3, wherein during a program operation of the memory cell:
   the bit line is at a first voltage;
   the read word line is at the first voltage;
   the program word line is at the first voltage;
   the high voltage control line is at a second voltage; and
   the low voltage control line is at a third voltage;
   wherein the second voltage is higher than the first voltage, and the first voltage is higher than the third voltage.

5. The memory cell of claim 3, wherein during a read operation of the memory cell:
   the read word line is at a fourth voltage;
   the program word line is at the fourth voltage;
   the high voltage control line is at the first voltage; and
   the low voltage control line is at the fourth voltage;
   wherein the fourth voltage is higher than the first voltage.

6. A memory array comprising:
   a plurality of bit lines;
   a plurality of read word lines;

a plurality of program word lines;
a plurality of high voltage control lines;
a plurality of low voltage control lines; and
a plurality of rows of memory cells, each memory cell comprising:
   a read selection transistor having a first terminal coupled to a corresponding bit line, a second terminal, and a control terminal coupled to a corresponding read word line;
   a program selection transistor having a first terminal directly coupled to the second terminal of the read selection transistor, a second terminal coupled to a corresponding high voltage control line, and a control terminal coupled to a corresponding program word line; and
   an anti-fuse capacitor having a first terminal directly coupled to the second terminal of the read selection transistor, and a second terminal coupled to a corresponding low voltage control line.

7. The memory array of claim 6, wherein:
the read selection transistor is an N-type transistor, and the program selection transistor is a P-type transistor.

8. The memory array of claim 7, wherein:
the first terminal of the anti-fuse capacitor has a gate structure, and the second terminal of the anti-fuse capacitor is an N-type doped region.

9. The memory array of claim 6, wherein:
memory cells disposed in a same row are coupled to a same read word line, a same low voltage control line, a same high voltage control line, different program word lines, and different bit lines.

10. The memory array of claim 6, wherein:
the plurality of rows of memory cells comprise a first memory cell and a second memory cell, the first memory cell and the second memory cell being disposed in a same column and two adjacent rows;
the first memory cell and the second memory cell are coupled to a same high voltage control line, a same bit line, and a same program word line; and
a second terminal of a program selection transistor of the first memory cell is coupled to a second terminal of a program selection transistor of the second memory cell.

11. The memory array of claim 10, wherein:
the plurality of rows of memory cells further comprise a third memory cell, the third memory cell and the second memory cell are disposed in two adjacent rows and a same column, and the third memory cell and the first memory cell are disposed in different rows;
the third memory cell and the second memory cell are coupled to a same bit line, and a same program word line; and
a first terminal of a read selection transistor of the third memory cell is coupled to a first terminal of a read selection transistor of the second memory cell.

12. The memory array of claim 11, wherein during a program operation of the first memory cell:
   a bit line coupled to the first memory cell is at a first voltage;
   a read word line coupled to the first memory cell is at the first voltage;
   a program word line coupled to the first memory cell is at the first voltage;
   a high voltage control line coupled to the first memory cell is at a second voltage; and
   a low voltage control line coupled to the first memory cell is at a third voltage;
   wherein the second voltage is higher than the first voltage, and the first voltage is higher than the third voltage.

13. The memory array of claim 12, wherein during the program operation of the first memory cell:
   a read word line coupled to the second memory cell is at the first voltage; and
   a low voltage control line coupled to the second memory cell is at a fifth voltage;
   wherein the second voltage is higher than the fifth voltage, and the fifth voltage is higher than the first voltage.

14. The memory array of claim 12, wherein during the program operation of the first memory cell:
   a read word line coupled to the third memory cell is at the first voltage;
   a high voltage control line coupled to the third memory cell is at the first voltage; and
   a low voltage control line coupled to the third memory cell is at the first voltage.

15. The memory array of claim 12, wherein during the program operation of the first memory cell:
   program word lines coupled to memory cells disposed in a same row as the first memory cell are at a fifth voltage; and
   wherein the second voltage is higher than the fifth voltage, and the fifth voltage is higher than the first voltage.

16. The memory array of claim 11, wherein during a read operation of the first memory cell:
   a read word line coupled to the first memory cell is at a fourth voltage;
   a program word line coupled to the first memory cell is at the fourth voltage;
   a high voltage control line coupled to the first memory cell is at a first voltage; and
   a low voltage control line coupled to the first memory cell is at the fourth voltage;
   wherein the fourth voltage is higher than the first voltage.

17. The memory array of claim 16, wherein during the read operation of the first memory cell:
   a read word line coupled to the second memory cell is at the first voltage; and
   a low voltage control line coupled to the second memory cell is at the first voltage.

18. The memory array of claim 16, wherein the first memory cell and memory cells disposed in a same row as the first memory cell are read simultaneously.

* * * * *